US008324734B2

(12) United States Patent
Gaidis

(10) Patent No.: US 8,324,734 B2
(45) Date of Patent: Dec. 4, 2012

(54) TUNNEL JUNCTION VIA

(75) Inventor: Michael C. Gaidis, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/364,494

(22) Filed: Feb. 2, 2012

(65) Prior Publication Data
US 2012/0133050 A1 May 31, 2012

Related U.S. Application Data

(62) Division of application No. 12/683,080, filed on Jan. 6, 2010, now Pat. No. 8,124,426.

(51) Int. Cl.
*H01L 23/48* (2006.01)
*H01L 23/52* (2006.01)
*H01L 29/40* (2006.01)

(52) U.S. Cl. ........... 257/774; 257/773; 257/E23.067; 257/E23.141; 365/158; 365/171; 365/173

(58) Field of Classification Search ............ 257/773, 257/774, E23.067, E23.141; 365/158, 171, 365/173; 438/3, 264, 597, 979
See application file for complete search history.

(56) References Cited

U.S. PATENT DOCUMENTS

| | | | |
|---|---|---|---|
| 4,356,341 A | 10/1982 | Borden et al. | |
| 4,794,442 A | 12/1988 | Warner, Jr. et al. | |
| 6,720,728 B2 | 4/2004 | Den et al. | |
| 6,783,999 B1 | 8/2004 | Lee | |
| 6,893,951 B2 | 5/2005 | Fricke et al. | |
| 7,294,868 B2 | 11/2007 | Debray et al. | |
| 2002/0038911 A1 | 4/2002 | Graas et al. | |
| 2003/0052320 A1 | 3/2003 | Tran et al. | |
| 2003/0185048 A1 | 10/2003 | Fricke et al. | |
| 2004/0017726 A1 | 1/2004 | Fricke et al. | |
| 2006/0162767 A1 | 7/2006 | Mascarenhas et al. | |
| 2008/0073658 A1 | 3/2008 | Wirth | |
| 2008/0198647 A1 | 8/2008 | Kanakasabapathy et al. | |
| 2010/0067293 A1 | 3/2010 | Yu et al. | |

OTHER PUBLICATIONS

Final Office Action dated Sep. 6, 2011; U.S. Appl. No. 12/683,080, filed Jan. 6, 2010; 11 pages.
PCT—"Notification of Transmittal of the International Search Report and the Written Opinion of the International Searching Authority, or the Declaration"; International Application No. PCT/EP2010/067602; International Filing Date: Nov. 16, 2010; Date of Mailing: Feb. 3, 2011; pp. 1-11.
Non-Final Office Action dated Apr. 20, 2011; U.S. Appl. No. 12/683,080, filed Jan. 6, 2010; 12 pages.
Notice of Allowance dated Oct. 19, 2011; U.S. Appl. No. 12/683,080, filed Jan. 6, 2010; 9 pages.

*Primary Examiner* — Leonard Chang
(74) *Attorney, Agent, or Firm* — Cantor Colburn LLP; Vazken Alexanian

(57) ABSTRACT

A memory device comprising a plurality of tunnel junctions (TJs) includes a bottom wiring layer; a top wiring layer; a plurality of TJs contacting the bottom wiring layer and the top wiring layer; and a plurality of tunnel junction vias (TJVs) contacting the bottom wiring layer and the top wiring layer, wherein the plurality of TJVs each have a lower resistance the each of the plurality of TJs, wherein the plurality of TJVs comprise at least one concave surface, and wherein the at least one concave surface of the plurality of TJVs is configured to trap etched material during formation of the TJVs so as to reduce the resistance of the plurality of TJVs.

12 Claims, 4 Drawing Sheets

100

FORM BASE LAYER WIRING
101

FORM TUNNEL JUNCTIONS
102

DIELECTRIC ENCAPSULATION
103

FORM VIA HOLES IN DIELECTRIC ENCAPSULATION
104

MULTILAYER MASKING; FORM WIRE SHAPES IN THE DIELECTRIC ENCAPSULATION
105

FORM TOP LAYER WIRING
106

200

FORM BASE LAYER WIRING
201

FORM TUNNEL JUNCTIONS AND TUNNEL JUNCTION VIAS
202

DIELECTRIC ENCAPSULATION
203

SIMPLE MASKING; FORM WIRE SHAPES IN DIELECTRIC ENCAPSULATION
204

FORM TOP LAYER WIRING
205

APPLY VOLTAGE PULSE TO BREAKDOWN TUNNEL JUNCTION VIAS
206

TUNNEL JUNCTION VIA

CROSS-REFERENCE TO RELATED APPLICATION

This application is a divisional application of U.S. application Ser. No. 12/683,080, to Gaidis et al., filed on Jan. 6, 2010.

BACKGROUND

This disclosure relates generally to the field of fabrication of tunnel junction device circuits.

DESCRIPTION OF RELATED ART

Arrays of tunnel junctions (TJs) are used to fabricate various electrical devices, including magnetoresistive random access memory (MRAM) arrays and superconducting Josephson junction circuits. A TJ comprises a junction between two different materials (for example, a sandwich structure with conductive base electrode material, insulating tunnel barrier material, and conductive top electrode material); electrons move between the two conductive materials via quantum tunneling across the insulating tunnel barrier material. A circuit with TJ-based devices may have a top metal layer, e.g., a back-end-of-line (BEOL) wiring level, contacting the top electrodes of the TJs, and a bottom metal wiring layer contacting the bottom electrodes of the TJs. One or more low-resistance peripheral contacts, or vias, may connect the bottom metal layer to the top metal layer. A via may comprise a low-resistance metal such as copper or tungsten. Via connections from the top metal layer to the bottom metal layer, across the TJ device layers, may be fabricated using a dedicated photomask level and single- or dual-Damascene metallization. FIG. 1 illustrates an embodiment of a method of forming a tunnel junction circuit comprising a via. In block 101, base, or bottom, layer wiring is formed for connecting circuitry to the bottom of the tunnel junction structures. In block 102, the tunnel junctions are formed by any appropriate method, such as a masking and etching process. In block 103, a dielectric film is formed around the tunnel junctions. The top surface of the dielectric film may be planarized to integrate simply with ensuing lithography and etch steps. In block 104, the via holes are lithographically defined and etched into the dielectric to enable electrical connection to the base wiring layer formed in block 101. In block 105, top layer wiring trenches are formed using relatively complex multilayer masking in such a way that the via holes formed in block 104 are protected and/or planarized before the wiring trench lithography is applied. In block 106, the top layer wiring trenches and vias are filled with metal using, for example, a single- or dual-Damascene process.

The processing steps necessary to create via structures in a TJ-device circuit may reduce yield of the circuit, as the processing steps may cause defects in critical regions of the circuit, or a faulty via may be formed. Over time, the vias may also be prone to formation of open circuits, causing failure in circuit operation. Further, via formation may be relatively expensive; the processing steps and lithography required for via formation may be as much as 10% of the total cost of back-end-of-line (BEOL) processing for a TJ-device circuit.

BRIEF SUMMARY

In one aspect, a memory device comprising a plurality of tunnel junctions (TJs) includes a bottom wiring layer; a top wiring layer; a plurality of TJs contacting the bottom wiring layer and the top wiring layer; and a plurality of tunnel junction vias (TJVs) contacting the bottom wiring layer and the top wiring layer, wherein the plurality of TJVs each have a lower resistance the each of the plurality of TJs, wherein the plurality of TJVs comprise at least one concave surface, and wherein the at least one concave surface of the plurality of TJVs is configured to trap etched material during formation of the TJVs so as to reduce the resistance of the plurality of TJVs.

In another aspect, a memory device comprising a plurality of tunnel junctions (TJs) includes a bottom wiring layer; a top wiring layer; a plurality of TJs contacting the bottom wiring layer and the top wiring layer; and a plurality of tunnel junction vias (TJVs) contacting the bottom wiring layer and the top wiring layer, wherein the plurality of TJVs each comprise a short circuit between the bottom wiring layer and the top wiring layer, wherein the plurality of TJVs comprise at least one concave surface, and wherein the at least one concave surface of the plurality of TJVs is configured to trap etched material so as to cause short-circuit breakdown of the plurality of TJVs when subjected to a voltage configured to cause short-circuit breakdown of the plurality of TJVs.

In yet another aspect, a tunnel junction via (TJV) connecting a top wiring layer to a bottom wiring layer for the purpose of interlayer low-resistance connection in a memory device, includes a first layer of a conductive material; a tunnel barrier on top of the first layer of conductive material; and a second layer of the conductive material on top of the tunnel barrier, wherein the TJV comprises a short circuit between the bottom wiring layer and the top wiring layer, wherein the TJV comprises at least one concave surface, and wherein the at least one concave surface of the TJV is configured to trap etched material so as to cause short-circuit breakdown of the TJV when the TJV is subjected to a voltage configured to cause short-circuit breakdown of the TJV.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a tunnel junction via (TJV) are provided, with exemplary embodiments being discussed below in detail.

Conventional via processing may be eliminated in the fabrication of a TJ array by replacing metallic vias with tunnel junction via (TJV) structures. A TJV may be formed at the same time and from the same material as the TJs. The TJVs may have a relatively low resistance, such that TJVs may act as substitutes for metallic vias. A TJV may be made relatively large in area compared to a TJ device in order to lower the resistance of the TJV. TJVs are advantageous where overlay tolerance between a via and the TJ device structures is critical. This is because TJV formation does not require a separate via lithography level aligned to the TJ level, so multilevel mask overlay errors do not arise. TJVs may print from the same lithography mask as the TJs, ensuring good alignment. TJVs may also be used in varied types of processing, such as trench-first dual-damascene processing, that may not allow formation of copper vias due to the via size or feature shape. Further, the TJV material may form a short circuit upon failure, allowing continued operation of the TJV in the TJ array, whereas a standard metallic via may form an open circuit upon failure, causing the via to become inoperable.

TJV resistance may be further lowered by forming the TJV in a shape that enhances sidewall redeposition during etch definition of the TJV. For example, rather than a convex, circular shape, a TJV may have a dumbbell-type shape, with concave inclusions that serve to trap etched material. The trapped etched material may act as a shunt of the tunnel barrier, lowering its resistance to levels desirable for multilevel wire interconnects. Additionally, a TJV may be electronically addressed during circuit building and testing such that the TJV may be subjected to a relatively large voltage pulse in operation without subjecting the TJs to the relatively large voltage pulse. The relatively large voltage pulse may cause tunnel barrier breakdown of the TJV, forming a short circuit and lowering the resistance of the TJV material.

Figure 1:
FIG. 1 is a flow diagram illustrating an embodiment of a method of forming a tunnel junction circuit comprising a metallic via.
Figure 1:
Figure 1:
Figure 1:
Figure 1:
Figure 2:
FIG. 2 is a flow diagram illustrating an embodiment of a method of forming a tunnel junction circuit comprising a tunnel junction via.
Figure 2:
Figure 2:
Figure 2:
Figure 2:

FIG. 2 illustrates an embodiment of a method of forming a tunnel junction circuit comprising a TJV. In block 201, base, or bottom, layer wiring is formed for connecting circuitry to the bottom of the tunnel junction structures. In block 202, the TJs and TJVs are formed simultaneously by any appropriate method, such as a masking and etching process. In block 203, a dielectric film is formed around the TJs and the TJVs. The top surface of the dielectric film may also be planarized. In block 204, top layer wiring trenches are formed using simple lithography and etching. As there are no via holes to planarize or protect, the masking of the etch can be performed with relatively simple single-level photoresist processing. The etched wiring trenches expose the top electrodes of the TJs and TJVs. In block 205, the top layer wiring trenches are filled with metal, using, for example, a single-Damascene process. In block 206, the TJV is optionally subjected to a relatively large voltage pulse, causing tunnel barrier breakdown in the TJV, thereby lowering the resistance of the TJV structure. The TJV may be addressed such that the TJs are not affected by the relatively large voltage pulse.

Figure 3:
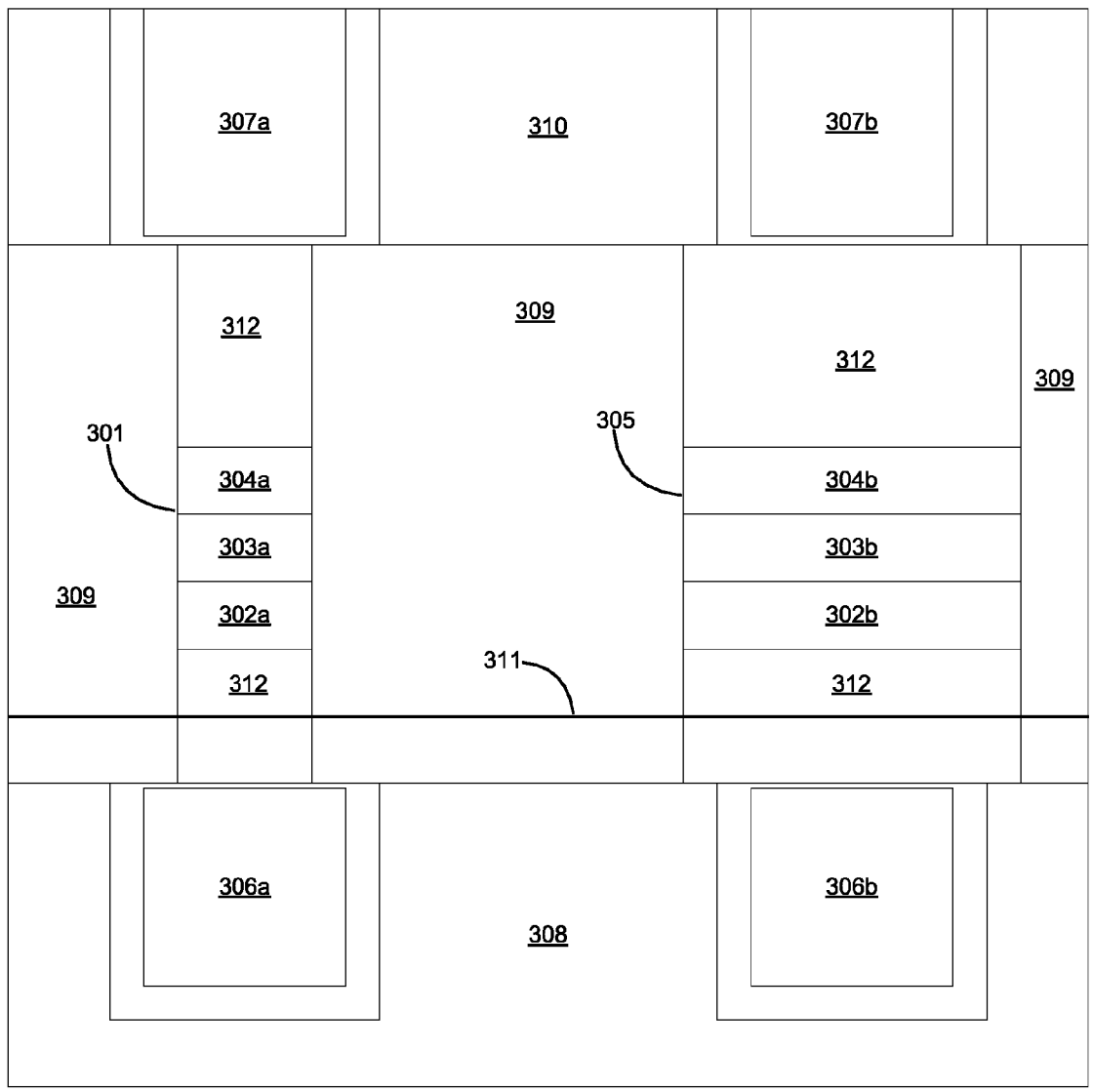
FIG. 3 illustrates a cross-sectional view of an embodiment of a tunnel junction circuit comprising a tunnel junction via.

A cross section 300 of an embodiment of a tunnel junction circuit comprising a TJ 301 and TJV 305 is shown in FIG. 3. TJ 301 and TJV 305 each comprise two TJ material layers (302a-b and 304a-b) separated by a tunnel barrier (303a-b). TJ material 302a-b and 304a-b may comprise a magnetic or superconducting material such as cobalt, iron, boron, niobium, aluminum, or nickel in some embodiments, and tunnel barriers 303a-b may comprise magnesium oxide or aluminum oxide in some embodiments. Wiring layer 308 may comprise a front end of line (FEOL) or low-level back end of line (BEOL) wiring layer in some embodiments. Contacts 306a and 306b in wiring layer 308 may further connect to circuitry below layer 308. Bottom contacts 306a-b may comprise copper in some embodiments. Bottom contact 306a is connected to TJ 301, and bottom contact 306b is connected to TJV 305. Wiring layer 310 may comprise a BEOL wiring layer in some embodiments. TJ 301 is connected to top contact 307a, which is part of wiring layer 310. TJV 305 is connected to top contact 307b, which is also part of wiring layer 310. Top contacts 307a-b may comprise copper in some embodiments. Insulating dielectric layer 309 surrounds TJ 301 and TJV 305. The TJ 301 and the TJV 305 may be formed simultaneously, using the same method; however, for reduced electrical resistance, the TJV 305 may be formed to be larger than TJ 301, as shown in FIG. 3. Regions 312 may comprise any appropriate conductive material that provides electrical continuity between wiring layer 308 and wiring layer 310.

Figure 4:
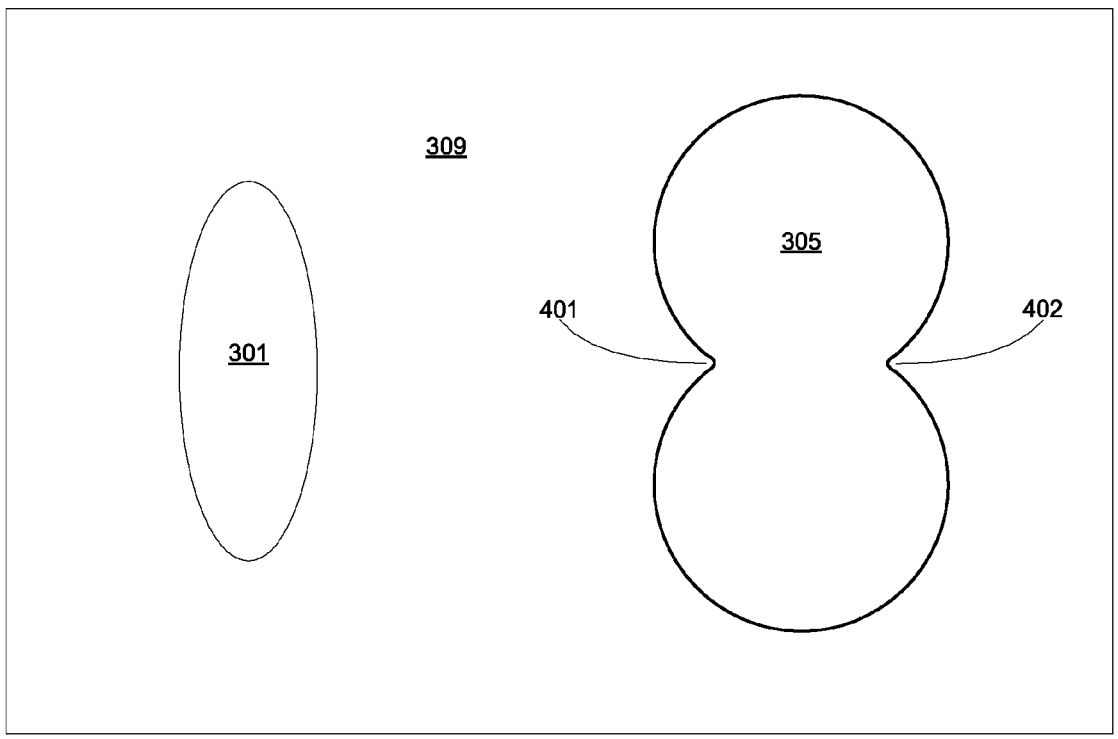
FIG. 4 illustrates a top-down view of an embodiment of a tunnel junction circuit comprising a tunnel junction via.

The TJV 305 may also have one or more concave surfaces, as shown in FIG. 4. FIG. 4 illustrates an embodiment of a top-down view 400 of circuit 300 taken along line 311 of FIG. 3. TJ 301 and TJ 305 are surrounded by insulating dielectric material 309. TJ 301 comprises a convex shape, while TJV 305 may comprise one or more concave surfaces, such as concave surfaces 401 and 402, that that serve to trap etched material during etching. TJ 301, and TJV 305 with concave surfaces 401 and 402, are shown for illustrative purposes only; embodiments of a TJ may comprise any appropriate shape, and embodiments of a TJV may comprise a convex surface, or any appropriate shape having one or more concave surfaces.

The technical effects and benefits of exemplary embodiments include elimination of via processing and simplification of wiring etch mask formation in the formation of a circuit comprising a tunnel junction devices.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A memory device comprising a plurality of tunnel junctions (TJs), the memory device comprising:
   a bottom wiring layer;
   a top wiring layer;
   a plurality of TJs contacting the bottom wiring layer and the top wiring layer; and
   a plurality of tunnel junction vias (TJVs) contacting the bottom wiring layer and the top wiring layer, wherein the plurality of TJVs each have a lower resistance the each of the plurality of TJs, wherein the plurality of TJVs comprise at least one concave surface, and wherein the at least one concave surface of the plurality of TJVs is configured to trap etched material during formation of the TJVs so as to reduce the resistance of the plurality of TJVs.

2. The memory device of claim 1, wherein at least one of the plurality of TJVs is larger than at least one of the plurality of TJs.

3. The memory device of claim 1, wherein the bottom wiring layer comprises a front end of line (FEOL) wiring layer, and the top wiring layer comprises a back end of line (BEOL) wiring layer.

4. The memory device of claim 1, wherein the plurality of TJs and the plurality of TJVs each comprise two layers of conductive material separated by a tunnel barrier.

5. The memory device of claim 1, wherein the plurality of TJVs are electrically addressed separately from the plurality of TJs.

6. A memory device comprising a plurality of tunnel junctions (TJs), the memory device comprising:
   a bottom wiring layer;
   a top wiring layer;
   a plurality of TJs contacting the bottom wiring layer and the top wiring layer; and
   a plurality of tunnel junction vias (TJVs) contacting the bottom wiring layer and the top wiring layer, wherein the plurality of TJVs each comprise a short circuit between the bottom wiring layer and the top wiring layer, wherein the plurality of TJVs comprise at least one concave surface, and wherein the at least one concave surface of the plurality of TJVs is configured to trap etched material so as to cause short-circuit breakdown of the plurality of TJVs when subjected to a voltage configured to cause short-circuit breakdown of the plurality of TJVs.

7. The memory device of claim 6, wherein at least one of the plurality of TJVs is larger than at least one of the plurality of TJs.

8. The memory device of claim 6, wherein the bottom wiring layer comprises a front end of line (FEOL) wiring layer, and the top wiring layer comprises a back end of line (BEOL) wiring layer.

9. The memory device of claim 6, wherein the plurality of TJs and the plurality of TJVs each comprise two layers of conductive material separated by a tunnel barrier.

10. The memory device of claim 6, wherein the plurality of TJVs are electrically addressed separately from the plurality of TJs.

11. A tunnel junction via (TJV) connecting a top wiring layer to a bottom wiring layer for the purpose of interlayer low-resistance connection in a memory device, comprising:
    a first layer of a conductive material;
    a tunnel barrier on top of the first layer of conductive material; and
    a second layer of the conductive material on top of the tunnel barrier, wherein the TJV comprises a short circuit between the bottom wiring layer and the top wiring layer, wherein the TJV comprises at least one concave surface, and wherein the at least one concave surface of the TJV is configured to trap etched material so as to cause short-circuit breakdown of the TJV when the TJV is subjected to a voltage configured to cause short-circuit breakdown of the TJV.

12. The TJV of claim 11, wherein the bottom wiring layer comprises a front end of line (FEOL) wiring layer, and the top wiring layer comprises a back end of line (BEOL) wiring layer.

* * * * *